United States Patent [19]

Tanabe

[11] Patent Number: 5,103,256
[45] Date of Patent: Apr. 7, 1992

[54] IMAGE FORMING APPARATUS USING MASK ORIGINAL FORM

[75] Inventor: Kazunori Tanabe, Nagoya, Japan

[73] Assignee: Brother Kogyo Kabushiki Kaisha, Japan

[21] Appl. No.: 671,533

[22] Filed: Mar. 19, 1991

[30] Foreign Application Priority Data

Apr. 12, 1990 [JP] Japan ................................. 2-96692
Apr. 12, 1990 [JP] Japan ................................. 2-96693

[51] Int. Cl.⁵ ................... G03B 27/32; G03B 27/52; G03B 27/72
[52] U.S. Cl. ............................. 355/32; 355/35
[58] Field of Search ................. 355/32, 35, 326; 430/138

[56] References Cited

U.S. PATENT DOCUMENTS

| | | | |
|---|---|---|---|
| 4,810,614 | 3/1989 | Sangyoji et al. | 430/138 |
| 4,942,419 | 7/1990 | Nakai et al. | 355/32 X |
| 4,956,662 | 9/1990 | Sakai et al. | 355/32 X |
| 4,967,227 | 10/1990 | Suzuki et al. | 355/32 |
| 5,049,918 | 9/1991 | Hisada et al. | 355/35 X |
| 5,049,922 | 9/1991 | Kuzuya et al. | 355/32 |
| 5,051,772 | 9/1991 | Hattori | 355/32 |
| 5,068,685 | 11/1991 | Hisada et al. | 355/32 |
| 5,068,686 | 11/1991 | Taira | 355/32 |

*Primary Examiner*—Richard A. Wintercorn
*Attorney, Agent, or Firm*—Oliff & Berridge

[57] ABSTRACT

An image forming apparatus forms an image on a photosensitive recording medium by sequentially exposing light using each of plural mask members to form a component part of the image. A positioning mark is formed on each mask member. The apparatus comprises a mask member moving unit for moving the mask member and a sensing unit including a sensor for sensing the positioning mark and a supporting member formed so that a lower portion of the supporting member comes into contact with the mask member. The apparatus further comprises a controlling unit for controlling said mask member moving unit so that the mask member may be moved to a predetermined position on the photosensitive recording medium on the basis of a signal from the sensor. The sensing unit includes a recess corresponding to each sensor location. The distance between the sensor and the mask member can always be kept constant through the supporting member, because the supporting member comes into contact with the mask member. The accuracy of the positioning is, therefore, improved.

20 Claims, 4 Drawing Sheets

IMAGE FORMING APPARATUS USING MASK ORIGINAL FORM

This application is related to U.S. patent application Ser. No. 07/672,082, filed Mar. 19, 1991, entitled "Image Forming Apparatus Using Mask Original Form" the disclosure of which is incorporated by reference herein.

BACKGROUND OF THE INVENTION

1. Field of the Invention

The present invention relates to an image forming apparatus for exposing a photosensitive recording medium to light using a mask member, and more particularly to a sensing unit for sensing the mask member provided in a mask member positioning unit of the image forming apparatus, a color image being obtained by exposing to light the photosensitive recording medium which is closely contacted with the mask member on which an image information is formed.

2. Description of Related Art

An image forming apparatus is known which uses, for example, as in U.S. Pat. No. 4,810,614, light transmitting sheets (hereinafter referred to as mask members) having images thereon in black that are obtained by taking out red, green and blue components of a colored original image. With the image forming apparatus, photosensitive recording paper, to which color capsules are applied, is sequentially exposed to light using the three mask members to form an image at an exposing table.

FIG. 6 is a sectional view showing a portion of an image forming apparatus of the above-mentioned type in the area of the exposing table. A mask member 115 for red, another mask member 115 for green and a further mask member 115 for blue, all of which are formed by a laser printer or the like (not shown), are inserted one by one into an inlet port (not shown) and transported to an exposing table 102 by a pair of rollers 132 through mask member guides 124, 125 in the apparatus shown in FIG. 6. The mask member 115 arrives at a predetermined exposure position.

A photosensitive recording medium 106, such as that disclosed in U.S. Pat. No. 4,399,209, is arranged above the exposing table 102. Then, an exposure operation is performed while the photosensitive recording medium 106 and the mask member 115 for red transported to the exposing table are opposed to each other. A lamp 108 serving as a light source for the exposure is disposed under the exposing table 102, and three filters 110R, 110G and 110B for red, green and blue, respectively, are disposed above the lamp 108 such that they may selectively cover the lamp 108. Thus, the lamp 108 is first covered by the filter 110R for red, and the lamp 108 and the filter 110R are integrally moved from a left end to a right end of the exposing table 102. Only light of a red component is selected from light of the lamp 108 by the filter 110R. The red component light passes through a portion of the mask member 115 at which no image is formed, that is, through a sheet portion of the base material, but is intercepted by a black image portion of the mask member 115. Consequently, an exposed face of the photosensitive recording medium 106 is sensitized by red light in accordance with an image of the mask member 115 so that a latent image for red is formed thereon. After completion of such processing, the mask member 115 for red is fed from the exposing table 102 in a rightward direction.

Simultaneously with such storage of the mask member 115 for red, the mask member 115 for green is inserted into the image forming apparatus. After the mask member 115 for green comes to the position at which it is opposed to the photosensitive recording medium 106, the lamp 108 is moved from the left end to the right end of the exposing table 102 while it is kept covered by the filter 110G for green, thereby performing an exposure operation with green light. The mask member 115 for green is then fed from the exposing table in a rightward direction.

Simultaneously, the mask member 115 for blue is inserted and transported to the exposing table 102, and an exposing operation of the photosensitive recording medium 106 with blue light is performed in a similar manner.

Latent images for red, green and blue are thus formed in an overlapping relationship on the same surface of the photosensitive recording medium 106 by multiple exposures during the three exposing operations.

A sensor 141 of the positioning unit 131 is aligned with the mask member 115 at a predetermined position of the exposing table 102. The sensor 141 includes a reflection-type light sensor which reads a positioning mark printed on the mask member 115 adjacent to the pair of rollers 132. The rollers 132 are rotated for feeding the mask member 115 in a feeding direction. The sensor 141 is installed on an installation board 142.

In this case, the pair of rollers 132 are rotated to feed the mask member 115, and rotation of the rollers 132 is controlled on the basis of sensing signals output from the sensor 141 while the sensor 141 is reading the positioning mark (not shown) of the mask member 115. Accordingly, the mask member 115 is fed to a predetermined position of the exposing table 102 by the rollers 132.

Use of a device of this type, however, deteriorates the accuracy of the positioning of the mask member 115 with respect to the sensor 141, when the smoothness of the mask member 115 is spoiled by a curl or a distortion appearing on the mask member 115. The cause of this problem is that the sensor 141 does not correctly output the output signal when either the distance between the sensor 141 and the positioning mark on the mask member 115 is changed or when the signal output from the sensor 141 for sensing the positioning mark is changed.

SUMMARY OF THE INVENTION

Accordingly, it is an object of the present invention to overcome the above problems by providing an image forming apparatus in which the accuracy of the positioning of the mask member is improved, the accuracy never deteriorating with passage of time.

It is a further object of the present invention to stabilize the distance between the sensor and the mask member in an image forming apparatus so that the distance is always constant.

According to the present invention, there is provided an image forming apparatus to form an image on a photosensitive recording medium by sequentially exposing light using each of plural mask members to form a component part of the image, a positioning mark being formed on each mask member, the mask members being selectively positioned in a predetermined position on the photosensitive recording medium. The apparatus comprises: mask member moving means for moving the mask member to position the mask member in the predetermined position on the photosensitive recording medium; sensing means including a sensor for sensing the positioning mark and a supporting member formed so that a lower side of the supporting member comes into contact with the mask member; and controlling means for controlling the mask member moving means so that the mask member may be moved to a predetermined position on the photosensitive recording medium on the basis of a signal from the sensor.

According to the present invention thus constructed, the positioning mark on the mask member is sensed by the sensor in the sensing means. Thus, when the supporting member comes into contact with the mask member, the distance between the sensor and the mask member can always be kept constant through the supporting member. The accuracy of the positioning is, therefore, improved and the mask member can easily be sent to the position of the sensing means even if the smoothness of the mask member is spoiled by a curl or a distortion appearing on the mask member.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENT

Hereinafter, an embodiment of the present invention will be described in detail with reference to the drawings.

Figure 1:
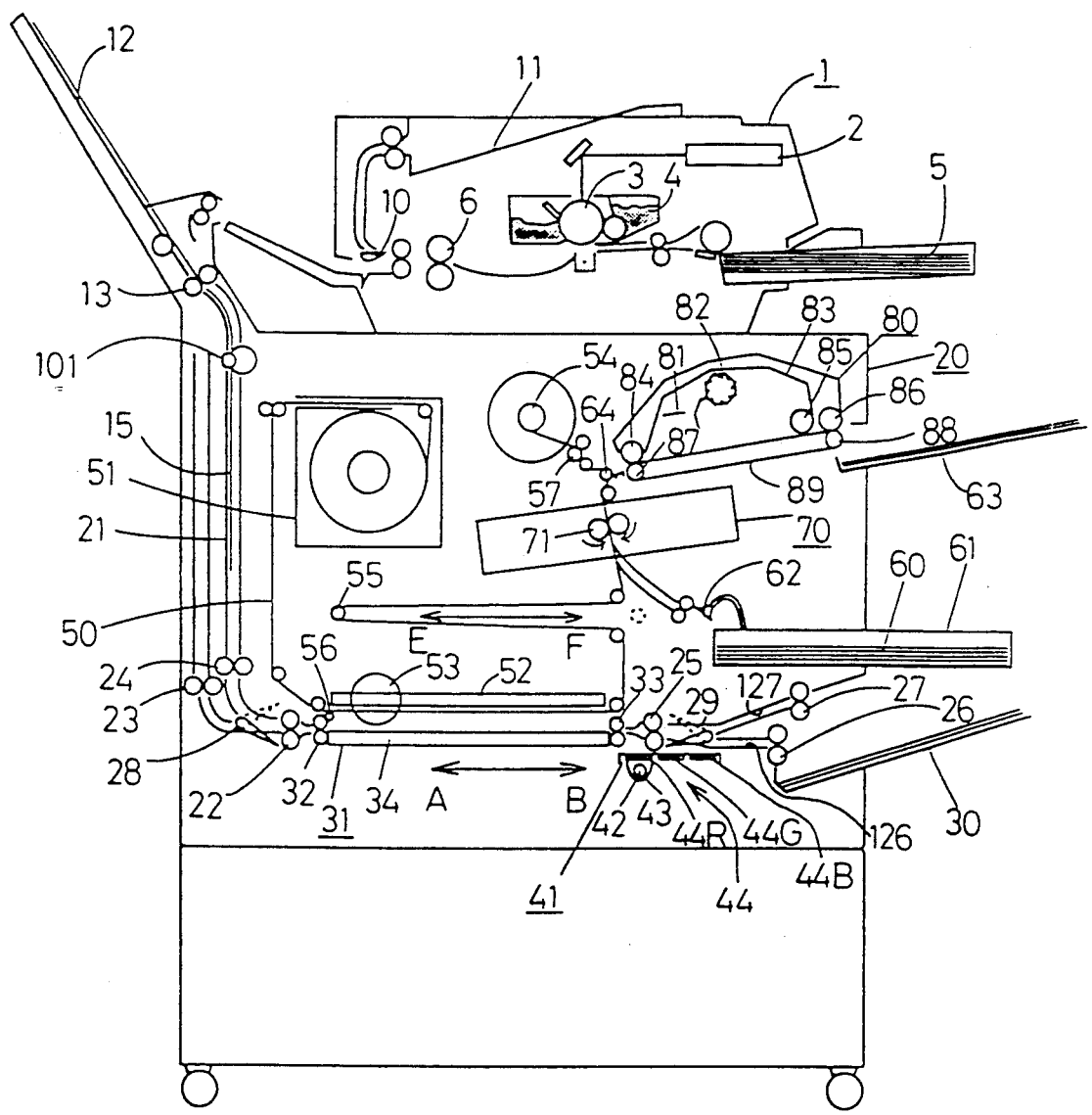
FIG. 1 shows an image forming apparatus according to one embodiment of the present invention.

FIG. 1 is a sectional view showing a monochromatic laser printer 1 and a color image recording apparatus 20 arranged in a coupled condition. For illustrative purposes, the monochromatic laser printer 1 is placed on top of the color image recording apparatus 20.

In the laser printer 1, a laser beam is directed to an electrically charged photosensitive member or drum 3 by means of a polygon scanner 2 to form an electrostatic latent image on the photosensitive drum 3. The electrostatic latent image formed on the photosensitive drum 3 is then developed by a developing unit 4. A toner image formed by such development is transferred to a plain paper sheet or an overhead projector (transparent) sheet supplied from a sheet cassette 5. The toner image is then fixed to the sheet by a fixing unit 6. Normally, the monochromatic laser printer records data transmitted from a host computer.

The sheet output from the laser printer 1 is directed into one of two routes by a sheet path selector 10. When a white/black image is required, the sheet is directed to a monochromatic discharge tray 11 or an automatic document feeder (hereinafter referred to as ADF) tray 12. When a color image is required, the sheet is directed first to the ADF tray 12 and then fed into the color image recording apparatus 20.

Sheets directed to the ADF tray 12 in this manner are then supplied, one-by-one, into the color image recording apparatus 20 by an ADF roller 13. A set of three such sheets, which have been output from the laser printer 1 and have monochromatic prints thereon, constitute a set of mask members 15 (15R, 15G and 15B) for subsequent use in the color image recording apparatus 20. Each of the mask members 15 thus output normally has a curl toward the side on which the image is formed. Correction of this curl will be addressed during the description of the color image recording apparatus 20.

A recurler roller pair 101 for removing a curl of a mask member 15 output from the laser printer is disposed intermediate of the mask member transport path 21.

The positioning unit 31 will now be described in detail with reference to FIG. 2 through FIG. 5.

A pair of rollers 32 and 33 for moving the mask member 15 in the feeding direction (the direction G shown in FIG. 5) are rotated by a motor 111, the motor functioning as a driving source through a plurality of gears and axles (not shown).

The pair of rollers 32 and 33 are rotatably supported about their roller axes on a positioning frame 113 which is movably installed in the horizontal direction on a main frame 112.

The positioning frame 113 is installed on the main frame 112 by a connection link 114 and horizontal move links 115, 116. The horizontal move links 115,116 are movably provided in the direction indicated by the arrows H and I shown in FIG. 5. They are moved by the driving power of the motors 117, 118 for movement in the horizontal direction and by the gears.

Figure 2:
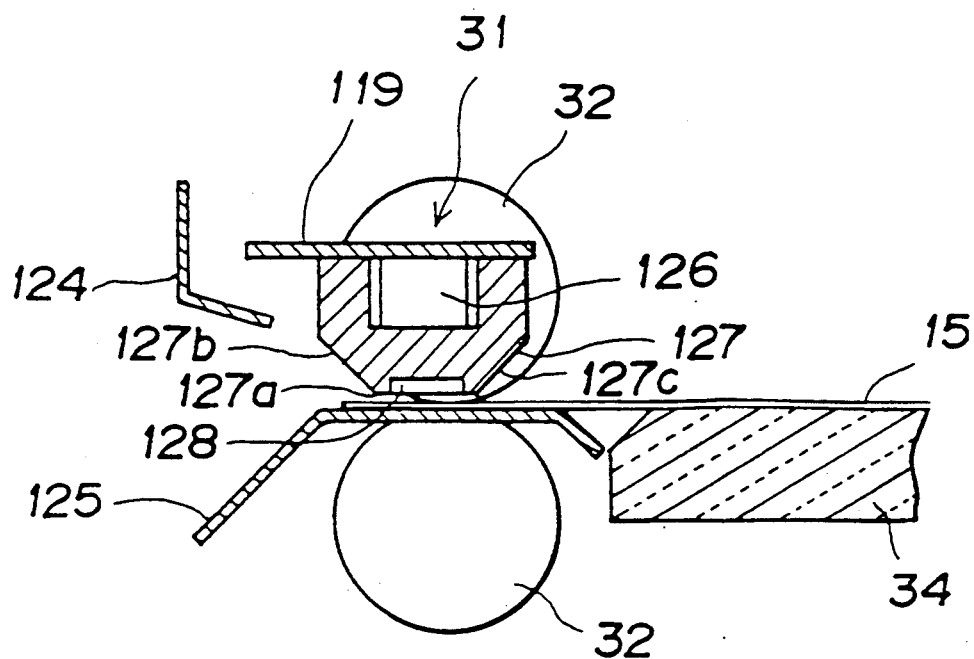
FIG. 2 is a schematic sectional view of a sensor part.

As shown in FIG. 2, positioning unit 31 includes sensors 126 for sensing the mask member 15, the roller pairs 32 and 33 disposed adjacent left and right end portions of the positioning unit 31, and a glass plate 34 disposed between the roller pairs 32 and 33.

In addition, the glass plate 34 is disposed in the upper side of the center portion of the positioning frame 113. The glass plate 34 supports the mask member 15 disposed between the pairs of rollers 32 and 33, and penetrates the light for the exposure from the lower side of the positioning frame 113. In the vicinity of the pair of rollers 32, an installation plate 119 for installing the sensors 126 is supported on the main frame 112.

In the vicinity of the left end of the mask member 15, a positioning mark 120 is printed simultaneously with image information when the mask member 15 is made.

Figure 3:
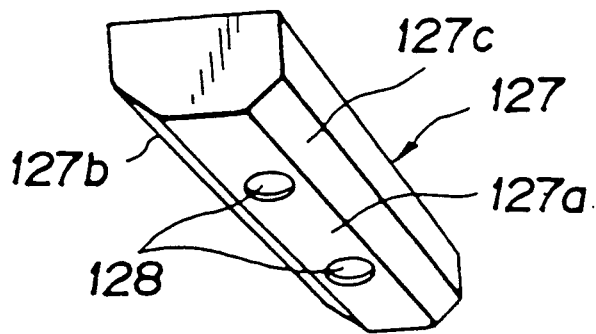
FIG. 3 is a perspective view from the lower side of the sensor part shown in FIG. 2.
Figure 5:
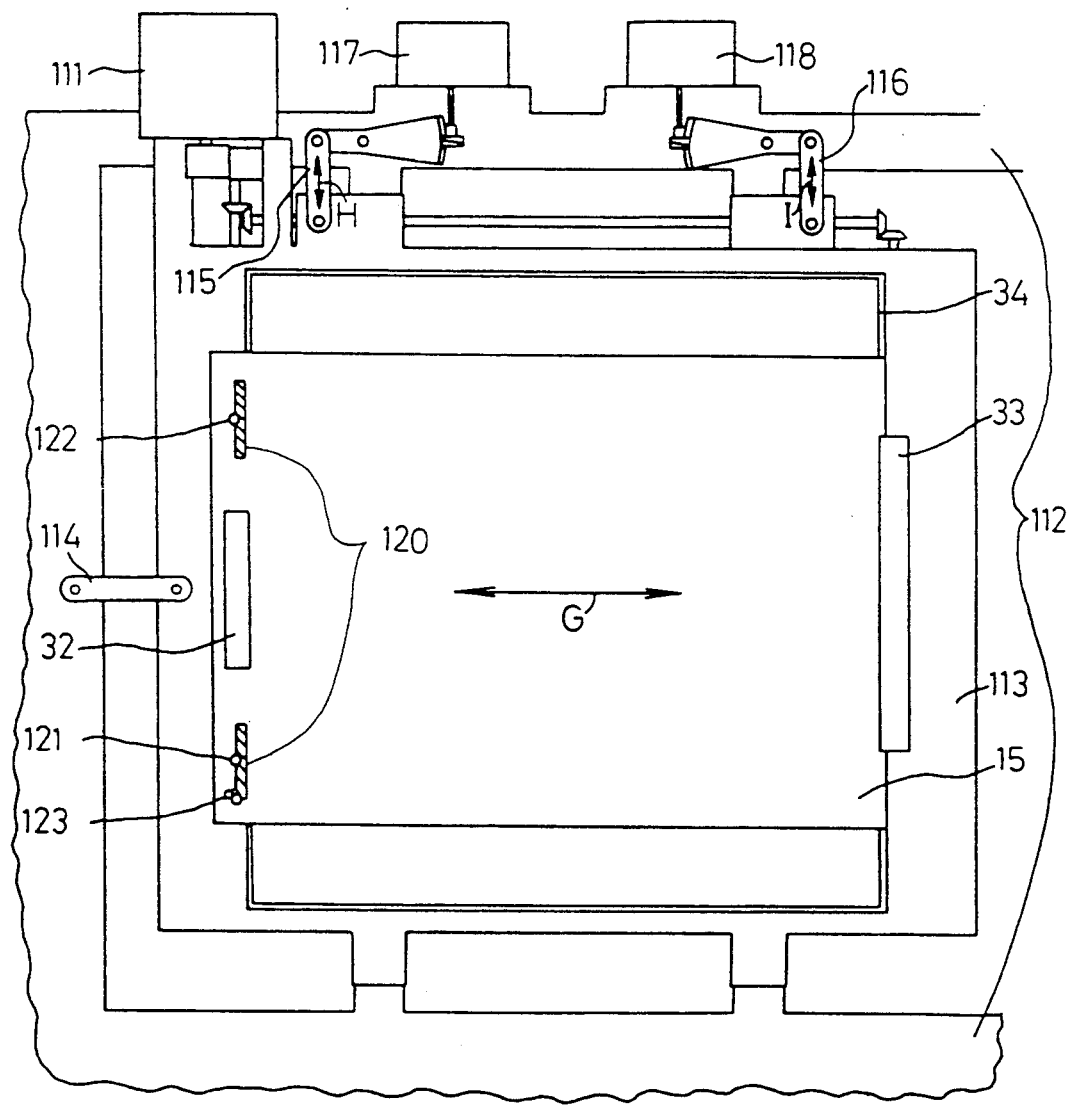
FIG. 5 is a schematic plan view of the positioning unit shown in FIG. 4.
Figure 6:
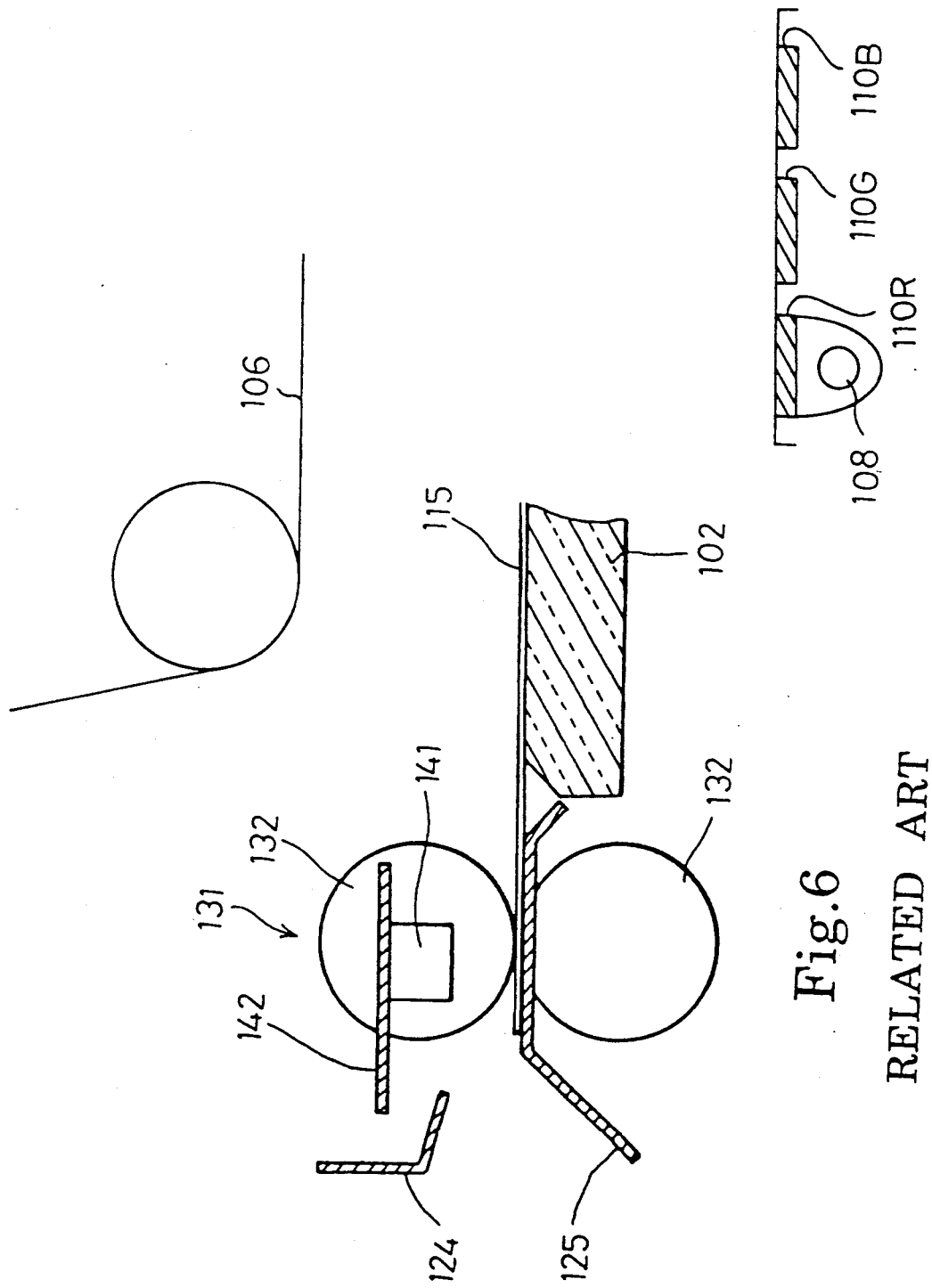
FIG. 6 is a schematic sectional view showing a mask member positioning unit according to the related art.

The sensors 126 contain a reflection type light sensor installed on the installation plate 119. The sensors 126 read the positioning marks 120 in each reading position 121, 122 and 123 (FIG. 5). The sensors 126 are stored in a transparent case 127 surrounding the sensors 126, and the sensors 126 are installed on the installation plate 119 with the transparent case 127 (FIGS. 2 and 3). The transparent case 127 is formed of conventional transparent resin.

Lower portion 127a of the transparent case 127 comes into contact with the mask member 15 which passes beneath the transparent case 127, and recesses 128 in the lower portion 127a corresponding to the sensor 126 are formed.

The lower portion 127a of the transparent case 127 comes into contact with the mask member 15 which passes beneath the transparent case 127, and may be dirtied by the toner which adheres to the mask member 15, but the insides of the recesses 128 of the transparent case 127 never become dirty.

Because of the space between the concave part 128 and the mask member 15, the sensors 126 are always clean, the sensors 126 correctly read the positioning marks 120, and steady positioning of the mask member 15 can be executed. The transparent case 127 has inclination portions 127b and 127c in the feeding direction of the mask member 15. Since inclination portions 127b and 127c are formed on both sides of the lower portion 127a in the feeding direction of the mask member 15, feeding of the mask member 15 is not obstructed under the sensors 126. Consequently, the probability of a paper jam occurrence is reduced.

Figure 4:
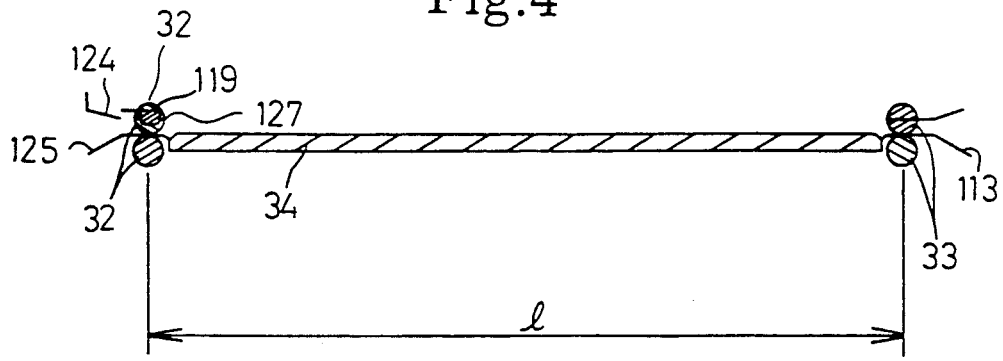
FIG. 4 is a schematic sectional view of a positioning unit.

The center distance between the pairs 32 and 33 of rollers is smaller than the length of the mask member 15, so that the mask member 15 is held at least by either the pair 32 of rollers or the pair 33 of rollers (FIG. 4).

An exposure device 41 is disposed below the positioning unit 31 such that it is movable in leftward and rightward directions along the lower surface of positioning unit 31. Exposure device 41 comprises a linear white light source (hereinafter referred to only as lamp) 42, a reflecting member 43 for reflecting light from the lamp 42, and a filter unit 44 including a red filter 44R, a green filter 44G and a blue filter 44B.

A photosensitive recording medium 50 comprises a web serving as a base material with a photosetting resin material and microcapsules applied to the web. The photosetting resin material contains, as a main material, a photopolymerization initiator as is known, for example, from U.S. Pat. No. 4,399,209 and Japanese Laid-Open Pat. No. 143044/1987, and is hardened by light of the wavelengths corresponding to red, green and blue. The microcapsules individually contain dye precursors of cyan, magenta or yellow. The photosensitive recording medium 50 is mounted in a cartridge so that it is not prematurely exposed to light. The photosensitive recording medium 50 is drawn from the cartridge 51 and first passes between the glass plate 34 and an exposure table 52. The photosensitive recording medium 50 is wound around a take-up roller 54 after passing a buffer 55, a pressure developing unit 70, a separating roller 64 and a drive roller 57.

When an exposure operation is to be performed by the exposure device 41, exposure table 52 is moved in a downward direction by a cam 53 so that a mask member 15, which has been transported onto the glass plate 34 by the roller pair 32, is closely contacted with the photosensitive recording medium 50. Meanwhile, a fastening roller 56 is located adjacent to a left end of the exposure table 52 so that, when the exposure table 52 is moved down to a predetermined position, the fastening roller 56 is pressed against a left end portion of the exposure table 52. As a result, while an exposure operation is taking place using one of the mask members 15R, 15G or 15B, the photosensitive recording medium 50 is held between and fixed by the exposure table 52 and fastening roller 56.

Color developer sheets 60, comprised of sheets having a color developer as disclosed, for example, in Japanese Laid-Open Pat. No. 88739/1983, are set in the cassette 61 such that the face to which the color developer is applied is directed downwardly. The color developer sheets 60 are supplied to the pressure developing unit 70 one-by-one from the cassette 61 by a suction cup 62 which is intermittently driven by a driving source (not shown). The color developer sheet 60 is pressured by a pair of pressure rollers 71 of the pressure developing unit 70 while it is held in an overlapping relationship with the photosensitive recording medium 50 that has been exposed to light. Consequently, the latent image formed on the photosensitive recording medium 50 by the exposure operation is changed into a visible image on the color developer sheet 60.

A thermal fixing unit 80 comprises a casing 83, a heater 81 and a vane wheel 82 located therein at upper locations, rubber rollers 84, 85 and 86 for the transportation of a color developer sheet 60 at a lower location, and an endless belt 89 extending between a pair of rollers 87 and 88.

The color developer sheet 60 fed from the pressure developing unit 70, and separated from the photosensitive recording medium 50 by the separating roller 64, is then glazed by the thermal fixing unit 80 and discharged to discharge tray 63.

Operation of the image forming apparatus having the construction as described above, when a plurality of color outputs are to be obtained from a set of mask members 15, will now be described.

First, a mask member 15R for red is produced by the monochromatic laser printer 1. The mask member 15R is a mask member which has toner on those areas where all microcapsules, containing dye precursors of yellow, cyan or magenta, are to remain unexposed or uncured and has clear areas to pass red light for curing or hardening the cyan microcapsules of the photosensitive recording medium 50. Subsequent actions, to be described, using mask members 15G and 15B with filters for providing green and blue light through the clear positions of the mask member will cure or harden the magenta and yellow microcapsules, respectively. In this instance, the mask member 15R output from the monochromatic laser printer 1 is sent to the ADF tray 12 and is then supplied to the color image forming apparatus 20 by the ADF roller 13.

Mask member 15R, when it is supplied to the color image recording apparatus 20, has a curl to the side of the sheet on which the image is formed. Mask member 15R follows the mask member transport path 21 and is fed to the recurler roller pair 101. Mask member 15R is thus recurled by the recurler roller pair 101 and then fed into the positioning unit 31 by the roller pairs 24 and 22. In this instance, the gate 28 remains at the position indicated by solid lines in FIG. 1.

The positioning unit 31 then transports the mask member 15R to the predetermined exposure position by the roller pair 32. Mask member 15R is accurately positioned by means of a driving source using a positioning mark printed on the mask member 15R that is read by means of sensors 126.

At this time, even if the smoothness of the mask member 15R was spoiled by a curl or if a distortion appeared on the mask member, the distance between the sensor 126 and the mask member 15R can always be kept constant through the transparent case 127 which stores the sensor 126 therein. Therefore, the accuracy of the positioning of the mask member 15R is improved.

When the mask member 15R is sent to the positioning unit 31 as mentioned above, the inclination portion 127b formed on the transparent case ensures that the mask member 15R is sent beneath the transparent case 127.

The lower portion 127a of the transparent case 127 comes into contact with the mask member 15R which passes beneath the transparent case 127. Lower portion 127a may be dirtied by the toner which adheres to the mask member 15R. However, since the recesses 128 are installed in the positions corresponding to the sensors 126 on the lower portion 127a, the insides of the recesses 128 and the spaces between the sensors 126 and the mask member 15R are prevented from becoming dirty as a result of passage of the mask member 15R.

It is to be noted that immediately before such positioning is performed, the exposure table 52 is moved down to the predetermined position by the cam 53 until the left end portion thereof is contacted with the fastening roller 56 so that the photosensitive recording medium 50 is fixed to the exposure table 52. After completion of such positioning, the exposure table 52 is further moved down by cam 53 until it is in contact with the glass plate 34 of the positioning unit 31. In this position, the mask member 15R and the photosensitive recording medium 50 are in close contact with one other.

After the exposure table 52 is brought into close contact with the positioning unit 31, the lamp 42 is lit with filter 44R positioned thereover, so that red light passes through the mask member 15R and irradiates the photosensitive recording medium 50. Since the exposure device 41 performs a scanning exposure in the direction indicated by arrow A, the entire photosensitive recording medium 50 on the exposure table 52 is exposed to the light. After completion of the scanning exposure, the lamp 42 is extinguished, and the exposure device 41 is returned to its initial position in the direction indicated by arrow B. At this time, the filter unit 44 is rotated by a driving source (not shown) so that the green filter 44G is positioned above the lamp 42.

While the exposure device 41 is being returned to its initial position, the exposure table 52 is moved up by rotation of the cam 53 to space the photosensitive recording medium 50 away from the positioning unit 31 and mask member 15R.

Back tension is normally applied to the photosensitive recording medium 50 from the center of rotation of the roll of the photosensitive recording medium 50, by means of a spring-biased frictional coupling between a shaft supporting the photosensitive recording medium 50 and a part of the apparatus frame (not shown), located in the cartridge 51. Accordingly, when the exposure table 52 is moved down, the photosensitive recording medium 50 is drawn from within the cartridge 51 by a length corresponding to the distance of downward movement of the exposure table 52, but when the exposure operation is completed and the exposure table 52 is moved up, the photosensitive recording medium 50 is rewound in a direction to take up any resulting slack.

After completion of the exposure by the mask member 15R for red, the exposure table 52 is moved up to the initial position by the cam 53. In this instance, since the fastening roller 56 remains in contact with the left end portion of the exposure table 52, the photosensitive recording medium 50 remains fixed with respect to the exposure table 52.

Subsequently, mask member 15G for green is produced by the monochromatic laser printer 1, and when the mask member 15G reaches a position directly forward of the roller pair 24 and past the ADF tray 12, ADF roller 13, recurler roller pair 101 and mask member transport path 21, the roller pairs 24, 22, 25 and 27 and the roller pairs 32 and 33 of the positioning unit 31 are rotated to transport the mask member 15R in the rightward direction to remove the mask member 15R from the positioning unit 31. Simultaneously, the mask member 15G is transported to and stopped at the exposure position. In this instance, the gates 28 and 29 are at the positions indicated by solid lines. Thus, the mask member 15R after exposure is transported into the upper branch path. Since the route extending from the roller pair 25 to the roller pair 27 past the gate 29 extends substantially linearly, jamming of a mask member 15 rarely occurs. Then, after a trailing end of the mask member 15R passes the gate 29 to allow subsequent changing over of the gate 29 to the position indicated by dotted lines, rotation of the roller pair 27 is stopped. Consequently, the mask member 15R is suspended above the mask member discharge tray 30 as it is partially held by the roller pair 27. Since the mask member discharge tray 30 is provided on a side of the body of the color image recording apparatus 20, the operator has ready access to the mask member 15R in such a standby condition.

The mask member 15G, introduced into the positioning unit 31, is positioned relative to the photosensitive recording medium 50 in the same manner as described for mask member 15R. Exposure table 52 is moved down to bring the mask member 15G into close contact with the glass plate 34 together with the photosensitive recording medium 50. The lamp 42 is then lit to effect an exposure operation with green light by way of the green filter 44G. After completion of the exposure operation, the exposure table 52 is moved up to the predetermined position. The exposure device 41 is moved back to its initial position while the filter unit 44 is moved to position the blue filter 44B above the lamp 42.

Subsequently, a further mask member 15B for blue produced by the monochromatic laser printer 1 is fed into the color image recording apparatus 20 in the same manner as was the case for the mask members 15R and 15G. After the mask member 15B is transported to the position directly forward of the roller pair 24, the roller pairs 24, 22, 25 and 26 and the roller pairs 32 and 33 of the positioning unit 31 are rotated in a direction to transport the mask member 15G in the rightward direction.

Consequently, the mask member 15G is fed from the positioning unit 31 while the mask member 15B is simultaneously transported to and stopped at the exposure position. In this instance, the gate 28 is at the position indicated by solid lines while the gate 29 is at the position indicated by broken lines. The mask member 15G, after exposure, is transported by the roller pair 26 until a trailing end thereof passes the gate 29. Thus, the mask member 15G is held in such a condition that it is partially clamped by the roller pair 26 and suspended above the mask member discharge tray 30.

The mask member 15B introduced into the positioning unit 31, is placed in close contact with the photosensitive recording medium 50 by the operation as described above, and in this condition, the photosensitive recording medium 50 is exposed to blue light.

By the operations described above, a latent image of a desired color image is recorded on the photosensitive recording medium 50. Subsequently, the exposure table 52 is moved up to its initial position. Thereupon, the fastening roller 56 and the left end portion of the exposure table 52 are spaced away from each other to release the photosensitive recording medium 50, and the buffer 55 is moved in the direction indicated by arrow E. As a result of the movement of the buffer 55, an unexposed portion of the photosensitive recording medium 50 is moved to a position below the exposure table 52 as photosensitive recording medium 50 is withdrawn from the cartridge 51.

The drive roller 57 is stopped when a leading end portion of the latent image on the photosensitive recording medium 50 comes to a position adjacent to the pressure roller 71 of the pressure developing unit 70.

A color developer sheet 60 is fed from within the cassette 61 by the suction cup 62 in synchronization with the movement of the photosensitive recording medium 50. The color developer sheet 60 is stopped at a position at which a leading end thereof corresponds to the leading end of the latent image of the photosensitive recording medium 50.

The pressure roller 71 of the pressure developing unit 70 is then rotated in the direction indicated by the arrow by a known driving device (not shown) to press, under pressure, the color developer sheet 60 with that portion of the photosensitive recording medium 50 on which the latent image is formed.

Simultaneously, the exposure table 52 is moved down to the predetermined position until the left end thereof is in contact with the fastening roller 56, thereby fixing the photosensitive recording medium 50 to the exposure table 52.

The photosensitive recording medium 50 is then fed, under pressure and in contact with the color developer sheet 60, through developing unit 70. Consequently, those of the microcapsules on the photosensitive recording medium 50 which have not yet been hardened are ruptured by the pressure so that the color contained therein reacts with the developer on the color developer sheet 60 and a color image corresponding to the latent image on the photosensitive recording medium 50 is developed on the color developer sheet 60.

As the pressure roller 71 of the pressure developing unit 70 is rotated further in the direction indicated by the arrow, the buffer 55 moves in the direction indicated by arrow F.

When the leading end of the color developer sheet 60 comes to the separating roller 64, the color developer sheet 60 is peeled away from the photosensitive recording medium 50 and guided toward the thermal fixing unit 80.

In the thermal fixing unit 80, the color developer sheet 60 is heated by air which is heated by the heater 81 and circulated in the casing 83 by the vane wheel 82, thereby promoting color development of the color image of the color development sheet 60. Simultaneously, a binder polymer (binding resin) for fixing the color developing medium to base paper of the color developer sheet 60, is melted by heat, and, consequently, the surface of the color developer sheet 60 becomes smooth and produces a suitable degree of gloss.

The color developer sheet 60, after completion of the color developing and glossing processing, is then discharged into the discharge tray 63.

During the series of operations, including initial pressurized developing, promotion of color development and glossing as described above, the photosensitive recording medium 50 remains held between and fixed by the exposure table 52 and fastening roller 56. Consequently, while the developing processing for one color image is proceeding, exposure processing of a latent image for another color image can be performed on the exposure table 52.

When exposure for a second color image is to be performed using the previously used mask members 15, the mask member 15B at the exposure position is fed out in the leftward direction while the mask member 15R held at the position of the roller pair 27 is fed back into the positioning unit 31.

Accordingly, the roller pairs 24, 22, 25 and 27 and the roller pairs 32 and 33 of the positioning unit 31 are rotated to transport the mask member 15R in the leftward direction. In this instance, the gates 28 and 29 are at the positions indicated by solid lines in FIG. 1. The mask member 15B is held between the roller pair 24 and passes the gate 28, and when at a position at which a trailing end of mask member 15B has passed the gate 28, rotation of the roller pair 24 is stopped. Consequently, the mask member 15B is retained at that position by roller pair 24. Mask member 15R, fed into the positioning unit 31, is then positioned as described above, and the photosensitive recording medium 50 is exposed to red light when in close contact with the mask member 15R. Subsequently, the mask member 15R is fed out in the leftward direction from the exposure position while the mask member 15G, held by the roller pair 26, is fed into the positioning unit 31. In particular, the roller pairs 23, 22, 25 and 26 and the roller pairs 32 and 33 of the positioning unit 31 are rotated to transport the mask members 15R and 15G in the leftward direction. In this instance, the gates 28 and 29 are at the positions indicated by broken lines.

The mask member 15R is thus held between and fed by the roller pair 23. After a trailing end of mask member 15R passes the gate 28, rotation of the roller pair 23 is stopped and the mask member 15R is held in the mask member accommodating section 125. Mask member 15G is fed into the positioning unit 31 and positioned. Photosensitive recording medium 50 is then exposed to green light while in close contact with the mask member 15G. Subsequently, the mask member 15G is fed out in the rightward direction from the exposure position, and a similar operation is then performed to feed the mask member 15B held at the position of the roller pair 24 into the positioning unit 31 in place of the mask member 15G, and the photosensitive recording medium 50 is exposed to blue light while in close contact with mask member 15B. As a result, the latent image of the color image is formed on the photosensitive recording medium 50, and the color image is sequentially formed on a color developer sheet 60 as described above. By repeating a similar sequence of operations, a desired number of color images can be produced from a single set of mask members.

After the required number of color images have been produced from the same mask members 15, the mask members 15 are discharged into accommodating sections 125, 126 and 127 from the roller pair 27 or roller pair 26.

Further, when a second set of mask members 15 is output from the monochromatic laser printer while exposure processing of a series of color images from the first set of mask members 15 is proceeding, the second set of mask members 15 is stored in the ADF tray 12. Then, the stored mask members 15 are subsequently fed one-by-one into the color image recording apparatus 20 by the ADF roller 13 after the exposure processing for the preceding set of mask members 15 is completed.

As apparent from the foregoing description, the present invention provides an improvement in the reading accuracy of the sensor by maintaining constant the distance between the sensor, e.g., the reflection-type light sensor, and the mask member. Consequently, the fading gap of the color image can be reduced. Moreover, even if the lower surface of a transparent case is dirty as a result of the passage of the mask member, the inside of the recess is prevented from becoming dirty. The accuracy of the sensor reading of the positioning mark does not deteriorate due to the dirt caused by the passage of the mask member, since the recesses are provided on the lower surface of the transparent case, the recesses corresponding to sensor locations. Further, the device facilitates moving the mask member to the lower portion of the sensor, and the jamming of the mask member is reduced.

While this embodiment has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined ;in the following claims.

What is claimed is:

1. An image forming apparatus to form an image on a photosensitive recording medium by sequentially exposing the photosensitive recording medium to light using each of plural mask members to form a component part of the image, a positioning mark being formed on each said mask member, each of said mask members being selectively positioned in a predetermined position on the photosensitive recording medium, said apparatus comprising:
    mask member moving means for moving each said mask member to position the mask member in the predetermined position on the photosensitive recording medium;
    sensing means including a sensor for sensing the positioning mark and a supporting member formed so that a lower portion of the supporting member is adapted to come into contact with the mask member, said sensor producing a signal indicative of the location of the positioning mark; and
    controlling means for controlling said mask member moving means so that the mask member is moved to the predetermined position on the photosensitive recording medium on the basis of the signal produced by the sensor.

2. The image forming apparatus as defined in claim 1, wherein said sensor is positioned in said sensing means such that said sensor is spaced from the mask member.

3. The image forming apparatus as defined in claim 2, wherein said lower portion of said supporting member includes a recess and said sensor is located above said recess.

4. The image forming apparatus as defined in claim 1, wherein said sensing means includes a transparent member which covers said sensor.

5. The image forming apparatus as defined in claim 1, wherein said mask member moving means includes an exposing table to carry the mask member.

6. The image forming apparatus as defined in claim wherein said lower portion of said supporting member has inclined side surfaces.

7. The image forming apparatus as defined in claim 1, wherein said sensing means includes a plurality of said sensors.

8. The image forming apparatus as defined in claim 7, wherein each said mask member includes a plurality of positioning marks.

9. An image forming apparatus to form an image on a photosensitive recording medium by sequentially exposing light using each of plural mask members to form a component part of the image, a positioning mark being formed on each said mask member, said mask members being selectively positioned in a predetermined position on the photosensitive recording medium, said apparatus comprising:
    mask member moving means for moving each said mask member along a predetermined direction to position the mask member in the predetermined position on the photosensitive recording medium ;
    sensing means including a sensor for sensing the positioning mark and a transparent case formed so that a lower portion of the transparent case is adapted to come into contact with the mask member, the sensor being positioned in the transparent case, said sensor producing a signal indicative of the location of the positioning mark; and
    controlling means for controlling said mask member moving means so that the mask member is moved to the predetermined position on the photosensitive recording medium on the basis of the signal produced by the sensor.

10. The image forming apparatus as defined in claim 9, wherein said lower portion of the transparent case includes a recess spacing the sensor from the mask member.

11. The image forming apparatus as defined in claim 10, wherein said sensor is located in an upper portion of said transparent case above said recess of said transparent case.

12. The image forming apparatus as defined in claim 9, wherein said sensing means includes a plurality of said sensors.

13. The image forming apparatus as defined in claim 12, wherein each said mask member includes a plurality of positioning marks.

14. The image forming apparatus as defined in claim 9, wherein the transparent case has inclination portions which are formed on two opposite sides of the lower portion of the transparent case transverse to a feeding direction of the mask members.

15. An image forming apparatus to form an image on a photosensitive recording medium by sequentially exposing the photosensitive recording medium to light using each of plural mask members to form a component part of the image, said apparatus comprising:
    sensing means for sensing the position of each said mask member; and
    holding means for holding each said mask member a predetermined, uniformly spaced distance from said sensing means.

16. The image forming apparatus as defined in claim 15, wherein said sensing means includes at least one sensor located within a housing.

17. The image forming apparatus as defined in claim 16, wherein said housing has an upper portion and a lower portion, said at least one sensor being located in the upper housing portion.

18. The image forming apparatus as defined in claim 17, wherein said lower housing portion projects downward to contact each said mask member.

19. The image forming apparatus as defined in claim 18, wherein said lower housing portion has two oppositely inclined side surfaces and a lower surface, said lower surface being adapted to contact each said mask member.

20. The image forming apparatus as defined in claim 19, wherein said oppositely inclined side surfaces are located transverse to a mask member feeding direction. sensor.

* * * * *